(12) United States Patent
Gravell et al.

(10) Patent No.: US 6,900,387 B2
(45) Date of Patent: May 31, 2005

(54) BALANCED FLOW COOLING

(75) Inventors: Anthony R. Gravell, Reading (GB); Richard J. Barlow, Reading (GB)

(73) Assignee: Sun Microsystems, Inc., Santa Clara, CA (US)

( * ) Notice: Subject to any disclaimer, the term of this patent is extended or adjusted under 35 U.S.C. 154(b) by 45 days.

(21) Appl. No.: 10/354,423

(22) Filed: Jan. 30, 2003

(65) Prior Publication Data

US 2003/0141089 A1 Jul. 31, 2003

(30) Foreign Application Priority Data

Jan. 30, 2002 (GB) .............................................. 0202171
Aug. 6, 2002 (GB) .............................................. 0218257

(51) Int. Cl.[7] .............................. H02G 3/08; H05K 7/20
(52) U.S. Cl. .................. 174/50; 174/17 VA; 361/687; 361/694; 361/724; 454/184
(58) Field of Search .............................. 174/50, 17 VA, 174/16.1, 17 R, 58; 361/687, 694, 695, 724, 725, 726, 727; 454/184; 312/326; 165/80.3, 121, 126

(56) References Cited

U.S. PATENT DOCUMENTS

| | | | | |
|---|---|---|---|---|
| 4,126,269 A | * | 11/1978 | Bruges ........................ | 361/695 |
| 4,797,783 A | * | 1/1989 | Kohmoto et al. ........... | 361/695 |
| 5,136,464 A | * | 8/1992 | Ohmori ....................... | 361/694 |
| 5,335,144 A | * | 8/1994 | Maroushek ................. | 174/16.1 |
| 5,528,454 A | * | 6/1996 | Niklos ......................... | 361/695 |
| 5,949,646 A | * | 9/1999 | Lee et al. .................... | 174/16.1 |
| 6,000,464 A | * | 12/1999 | Scafidi et al. ............... | 174/16.1 |
| 6,052,282 A | * | 4/2000 | Sugiyama et al. ......... | 174/16.1 |
| 6,127,663 A | * | 10/2000 | Jones .......................... | 361/724 |
| 6,504,717 B1 | * | 1/2003 | Heard ......................... | 361/695 |
| 6,543,246 B2 | | 4/2003 | Wayburn et al. | |
| 6,643,123 B2 | * | 11/2003 | Hartel et al. ................ | 361/695 |
| 6,650,544 B1 | | 11/2003 | Lai | |

* cited by examiner

Primary Examiner—Dean A. Reichard
Assistant Examiner—Angel R. Estrada
(74) Attorney, Agent, or Firm—Meyertons Hood Kivlin Kowert & Goetzel, P.C.; B. Noël Kivlin

(57) ABSTRACT

There is described a modular electronic circuit wherein a series of electronics modules are penetrated by a passageway having an air-permeable wall, and cooling air is supplied to the passageway at a pressure above that obtaining in the modules, so that each module receives a supply of air passing out through the wall of the passageway. The passageway is constituted by a plurality of aligned tubular sleeves mounted in respective modules. There is also described a ventilation module including blowers to pressurize the passageway. A second passageway may be provided, at a reduced pressure, to extract air from the modules.

5 Claims, 4 Drawing Sheets

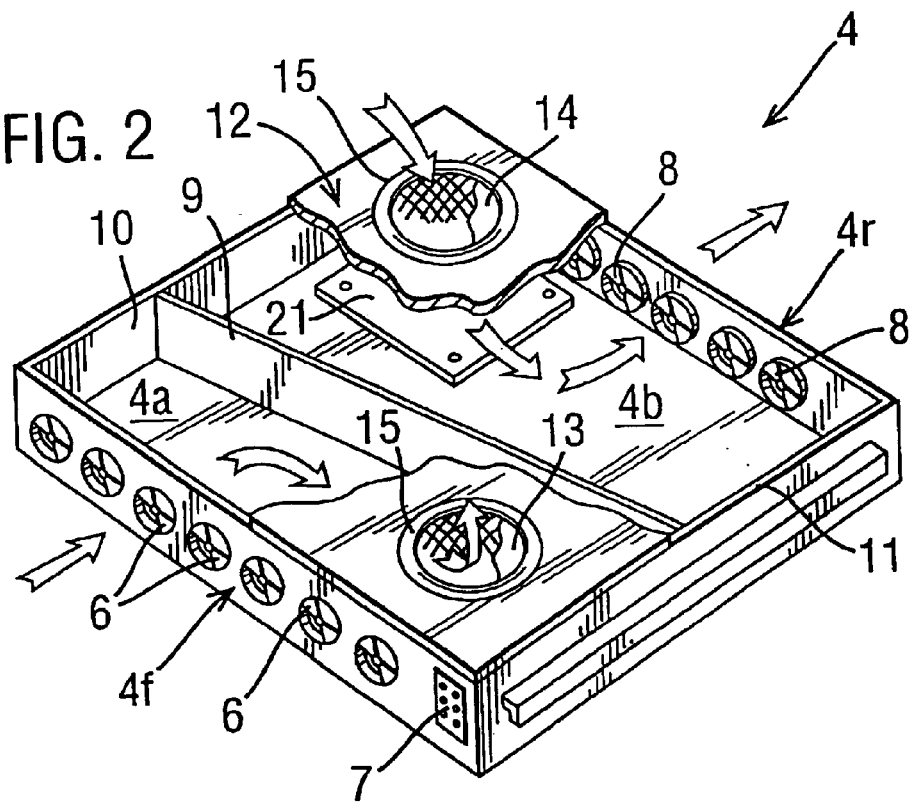
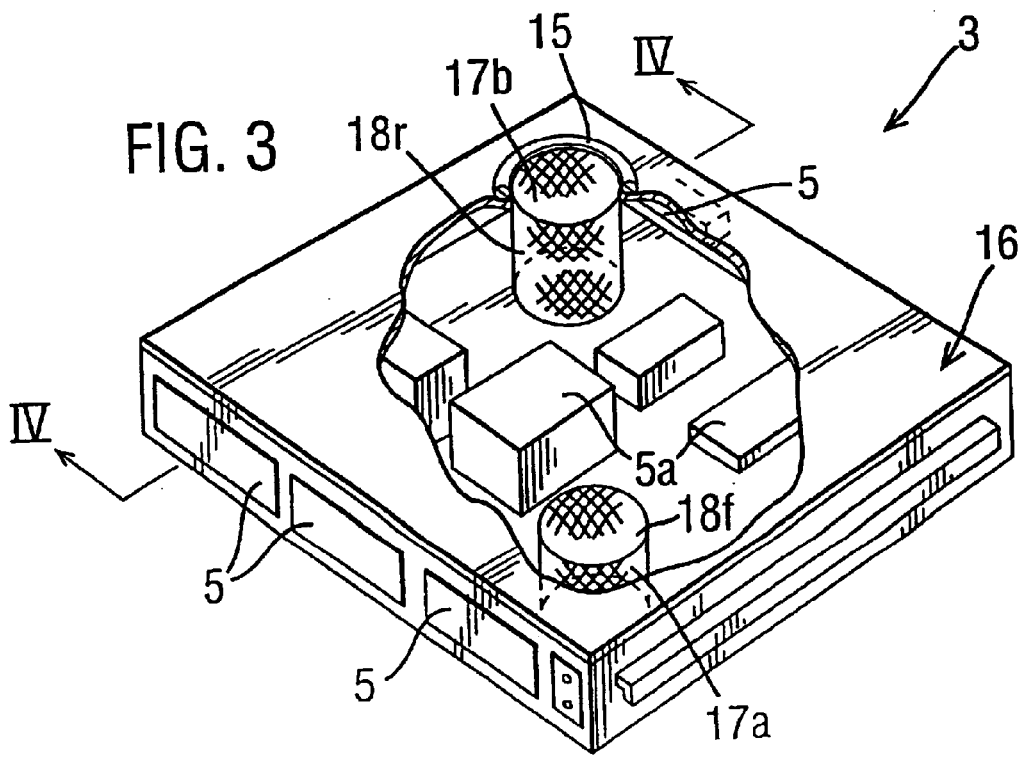

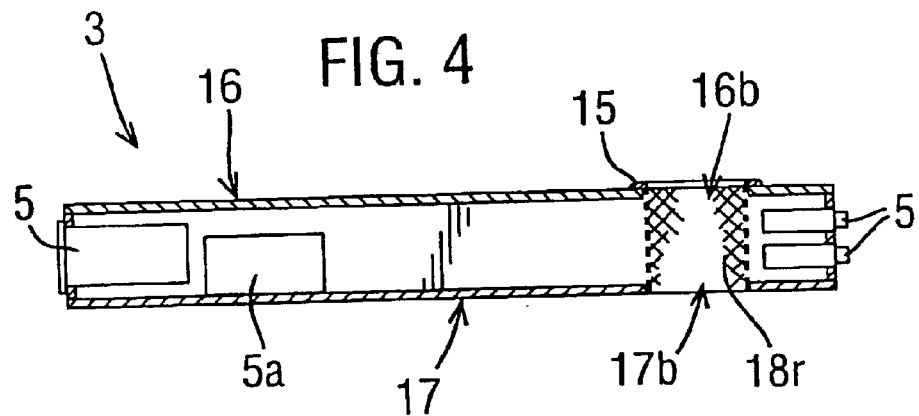
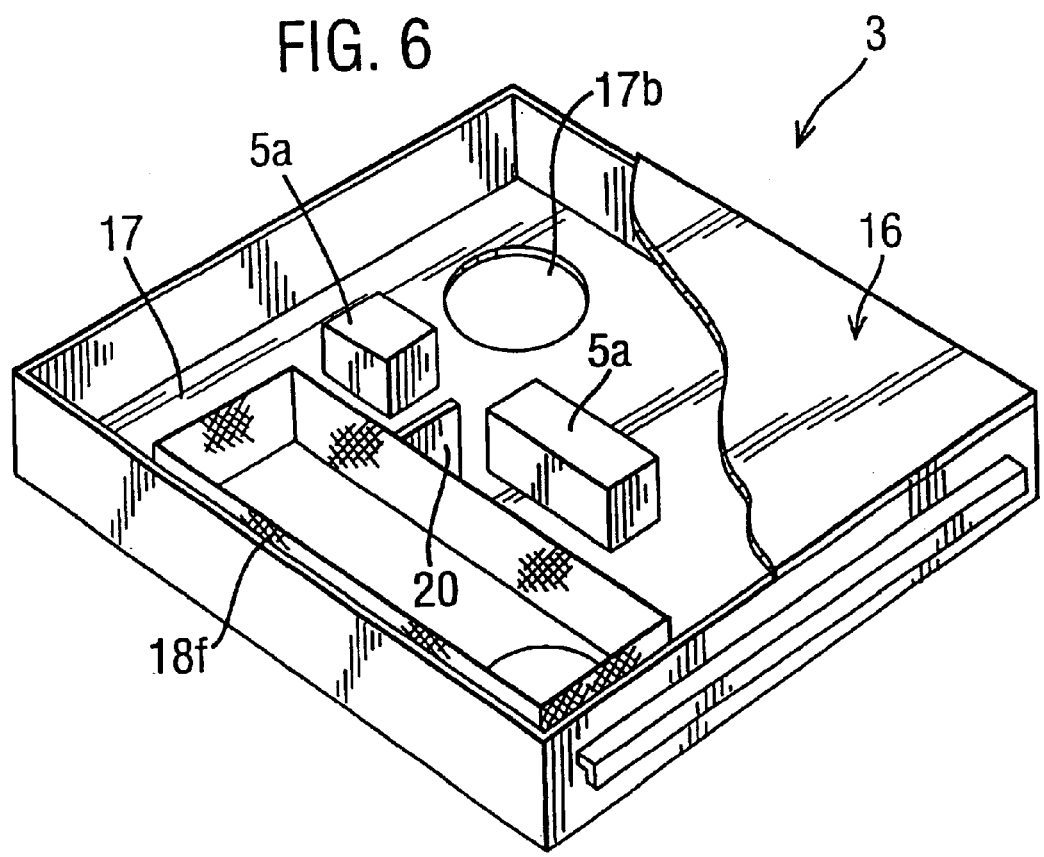

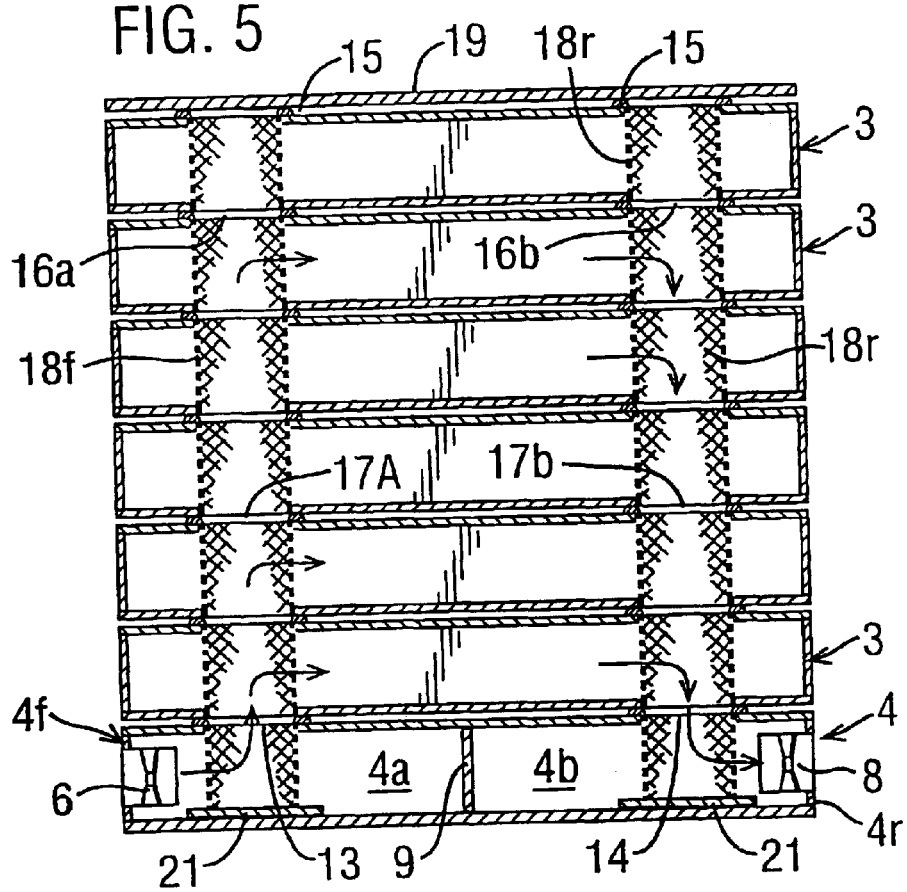
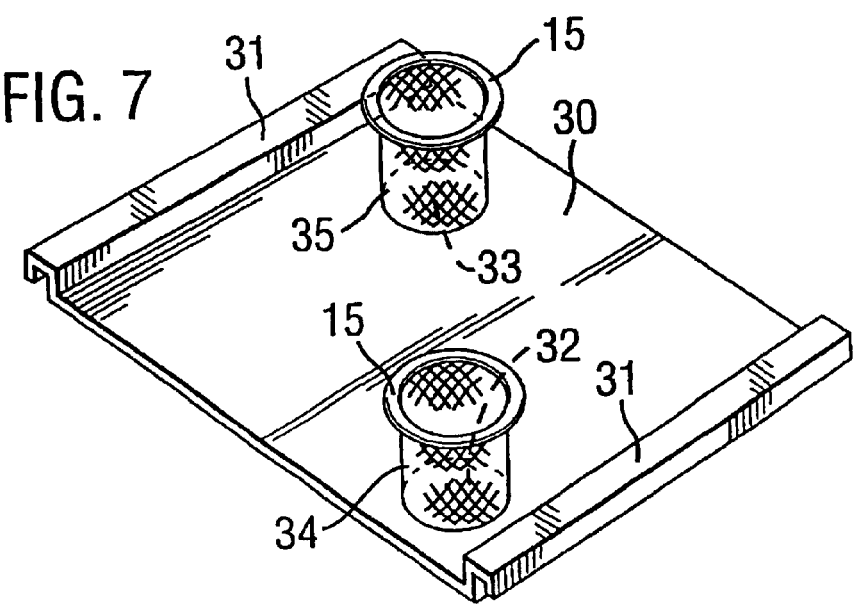

BALANCED FLOW COOLING

FIELD OF INVENTION

The present invention relates to modular electronic circuits, and is particularly concerned with the provision of cooling air flows through electronic circuit modules.

BACKGROUND OF THE INVENTION

Complex electronic circuits are frequently implemented by assembling a plurality of individually cased circuit modules in a supporting rack, with electrical interconnection between the modules being effected by cabling.

The electronic components within each module require cooling, and to provide such an airflow cooling fans are often installed on the front and/or back faces of each module so that air is drawn into the module through openings in the front face and is expelled through openings in the rear face.

When the modules are assembled into a rack, only the front and rear faces are accessible. As the circuit modules become more complex, the rear face of the module is increasingly taken up by the provision of connectors for linking the modules together, and the front face is increasingly occupied by devices such as indicator lights, disc drives, setting switches, etc. This increasing number and complexity of components mounted on the front and rear faces of the module leaves little room for ventilation fans or ventilation openings.

SUMMARY OF THE INVENTION

Embodiments of the present invention provide cooling air flows over the electronic components of the modules of a rack-mounted system, without taking up space on the front and/or rear faces of the modules for cooling fans or openings.

According to a first aspect of the present invention, there is provided a modular assembly for containing an electronic circuit, the assembly comprising a supporting structure, a number of circuit modules, and at least one ventilation module. The ventilation module comprises a plurality of air inlet openings on its front and/or rear face, and a ventilator or fan to move air through the cooling module from the inlet openings to an air supply opening on an upper or lower face of the ventilation module. Each of the circuit modules comprises openings on its upper and lower faces positioned so as to be in vertical alignment with the air supply opening of the ventilation module when the modules are assembled in the supporting structure. Extending between the openings of each module is a tubular permeable membrane. Air is supplied to the interiors of the tubular membranes, and passes out through the membranes in to the circuit modules to establish a cooling airflow over components housed in the modules.

The circuit modules may also comprise air exhaust openings in their respective upper and lower faces, arranged to be in vertical alignment when the modules are mounted in the supporting structure. The aligned exhaust openings may be provided with tubular membranes within each module to form a tubular exhaust manifold. The ventilation module may be provided with an air aspiration opening in its upper or lower face to communicate with the exhaust manifold, and extractor fans on its front and/or rear faces to draw in air through the aspiration opening and expel it through exhaust openings on the front and/or rear faces of the ventilation module.

In a combined supply and exhaust ventilation module, the interior of the ventilation module is divided into two regions, one of which communicates with an air supply opening and optionally has fan means to draw air into the module and expel it through the air supply opening, and the other region has an air exhaust opening and optionally exhaust fans to draw air into the module through the aspiration opening and expel it through exhaust openings in the front or rear face of the module. In one embodiment, the ventilation module has two sets of fans so that air is both blown out of the air supply opening and sucked in through the aspiration opening of the ventilation module.

A further aspect of the invention provides a housing for an electronic module for use in the assembly, the housing comprising upper and lower surfaces having aligned openings, and a tubular pressure control membrane extending within the module between the upper and lower surfaces of the module, to delimit an internal region of the module containing the upper and lower openings.

A yet further aspect of the invention provides for a "dummy" module to replace an electronics module in a rack while the electronics module is removed for servicing, the dummy module having mounting elements to cooperate with the rack, and ducts to provide a sealed connection between the air inlet and/or outlet openings of the electronics modules adjacent the removed module. Cooling air supply to the remaining modules is preserved by the presence of the dummy module, whose ducts replace the membranes of the removed module, so that the remaining electronics modules may continue to operate without overheating.

BRIEF DESCRIPTION OF THE DRAWINGS

Embodiments of the invention will now be described in detail, with reference to the accompanying drawings, in which:

FIG. 2 is a perspective cut away view of a ventilation module for use in the assembly;

FIG. 3 is a perspective cut away view of a circuit module for use in the assembly;

FIG. 4 is a sectional view through the circuit module of FIG. 3 along the line IV—IV;

FIG. 5 is a schematic vertical section through the modular assembly to show air circulation paths; and FIG. 6 is a schematic perspective view similar to FIG. 3 showing an alternative embodiment of the circuit module; and FIG. 7 is a perspective view of a dummy module for use in maintenance.

DETAILED DESCRIPTION OF SPECIFIC EMBODIMENTS

Figure 1:
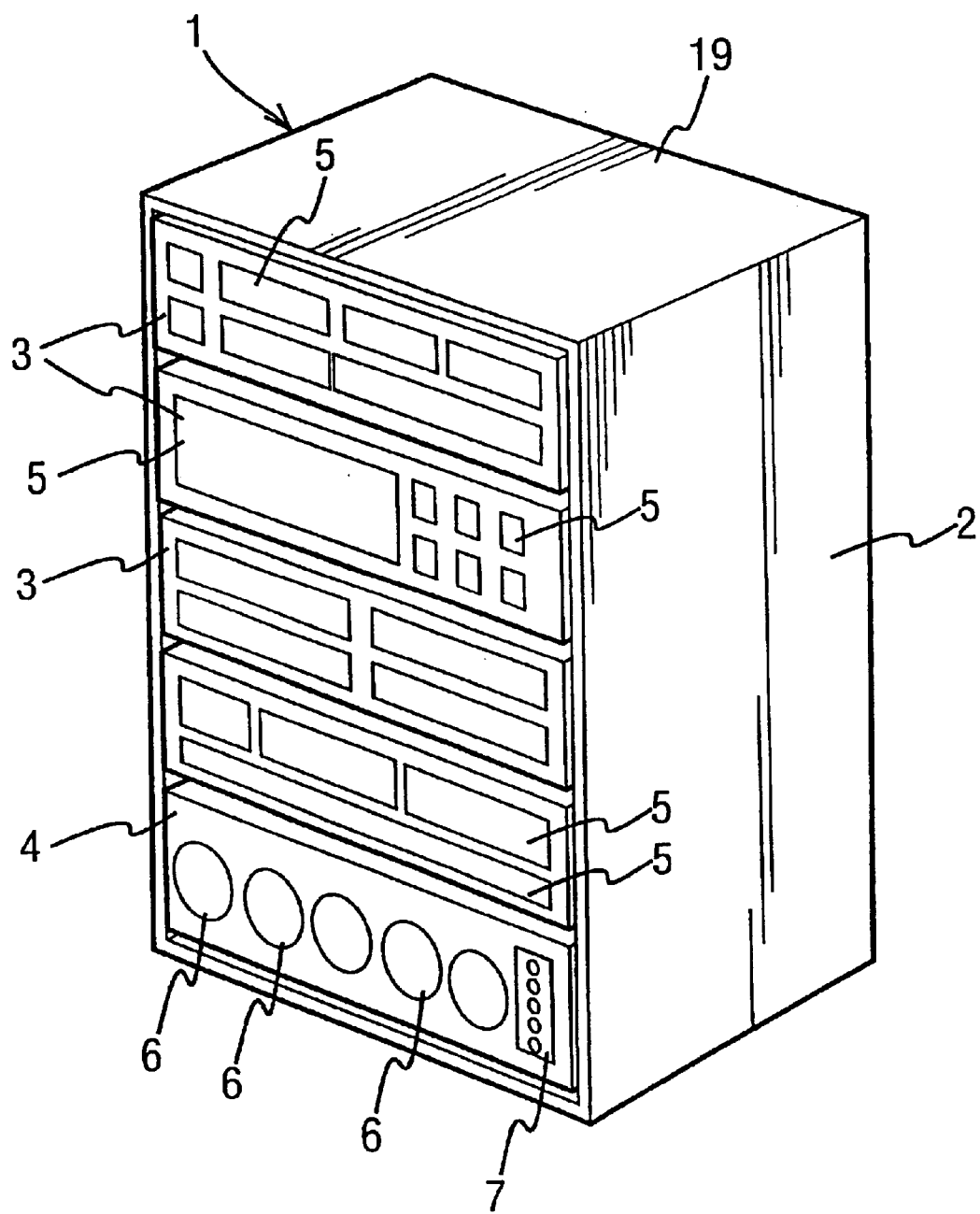
FIG. 1 is a schematic perspective view of a modular assembly.

Referring now to the drawings, in which like parts will be given like reference numerals, FIG. 1 shows a modular assembly 1 comprising a supporting structure or rack 2, a plurality of circuit modules 3 mounted in a vertically-extending array in the rack 2, and a ventilation module 4 mounted below the array of circuit modules 3. The front faces of the circuit modules 3 are visible in FIG. 1, and components 5 of the electronic circuits contained within the circuit modules 3 are mounted to the front faces of the modules. The components 5 may be switches, indicator devices, media drives, or other components to which access is required during operation or maintenance of the circuits contained in the modular assembly.

The ventilation module 4 has mounted to its front face a number of fans 6 and an indicator panel 7. The indicator panel 7 may comprise indicator lights to show the operational states of the fans 6 of the ventilation module 4.

FIG. 2 is a perspective view of the ventilation module 4. The module 4 comprises a front face 4f to which the fans 6 and indicator panel 7 are mounted, and a rear face 4r to which a plurality of extractor fans 8 are mounted. The interior of the module 4 is divided into front and rear regions 4a and 4b by a bulkhead 9, which extends between side walls 10 and 11 of the ventilation module 4. The side walls and bulkhead may be formed of any suitable impervious material, such as plastics or metal sheet.

The upper surface of the ventilation module 4 is formed with two openings, positioned on either side of the bulkhead 9. Adjacent the front face 4f of the ventilation module is an air supply opening 13 communicating with front region 4a of the interior of the module 4, and adjacent the rear face 4r of the ventilation module is an aspiration opening 14 communicating with the rear region 4b. In operation, the fans 6 draw air in through the front face 4f of the ventilation module, pressurising the front region 4a. This pressurised air is delivered through the air supply opening 13. Similarly, extractor fans 8 expel air from within the rear region 4b of the ventilation module through the rear face 4r, and this results in air being drawn into the module through the aspiration opening 14. Filter membranes formed from mesh or non-woven fabric may be provided adjacent the fans 6 and/or the fans 8, to catch airborne particles.

On the upper surface 12 of the ventilation module 4, resilient sealing elements 15 are provided to surround the air supply opening 13 and the aspiration opening 14, and will be described later in detail.

The indicator panel 7 of the ventilation module may include one or more indicator devices associated with each of the fans 6 and extractor fans 8, so that a malfunction of the fans 6 or extractor fans 8 will be indicated on the panel 7.

Referring now to FIGS. 3 and 4, there is shown a circuit module 3, comprising a substantially air tight casing housing a number of electronics components 5 mounted to its front and rear faces, and internal electronics components 5a. The wiring connecting the electronic components 5 and 5a has been omitted, for clarity. The casing may be formed from sheet metal, or from synthetic plastics material with or without fibre reinforcement.

The upper surface 16 and the lower surface 17 of each circuit module 3 are each formed with two openings 16a, 16b and 17a, 17b corresponding in position to the air supply opening 13 and the air aspiration opening 14 of the ventilator module 4, respectively. The circuit module 3 therefore comprises two pairs of vertically-aligned openings, one pair being aligned with the air supply opening 13, and the other pair being aligned with the aspiration opening 14 when the circuit module is placed above the ventilator module 4.

A tubular mesh sleeve 18f, 18r extends between the upper and lower surfaces 16 and 17 of the circuit module 3, between the openings of each vertically-aligned pair. The sleeves 18f, 18r may be formed from fine wire or plastics mesh, or may be formed from a thin layer of open-cell foam material or non-woven fabric, or from a textile material. The sleeves 18f, 18r are sealed to the upper and lower surfaces 16, 17 of the module by substantially airtight joints.

A respective seal member 15 surrounds each of the openings in the upper surface 16 of the circuit module 3, and extends above the upper surface 16 of the circuit module 3.

The modular assembly 1 of FIG. 1 is assembled by placing a ventilation module in the lowermost position in the supporting structure or rack 2 and arranging a number of circuit modules 3 into the supporting structure 2 vertically above the ventilation module 4. The vertical spacing between adjacent modules is such that the seals 15 on the upper surface of each module can form an air tight seal with the undersurface of the module above. With the modules assembled in the rack, the seals 15 of the uppermost module engage a top surface 19 of the supporting structure 2, effectively closing off the openings in the upper surface of the topmost module. The top surface 19 may be formed from metal sheet, or plastics material, or any other suitably impervious sheet material able to withstand the pressure difference between ambient and the pressure within the sleeves 18f and 18r.

As can be seen in FIG. 5, the air supply opening 13 in the ventilation module 4 communicates with the lower end of a vertically-extending passageway bounded by the mesh sleeves 18 adjacent the front faces of the circuit modules 3, while the aspiration opening 14 is in communication with the lower end of a passageway formed by the mesh sleeves 18 adjacent the rear faces of the circuit modules 3. The sleeves may, in one embodiment, comprise a skeletal frame formed from resilient material such as metal or plastics, with snap-engaging formation to cooperate with one or both of the upper and lower surfaces 16, 17 of the module. The mesh, foam or fabric filter material of the sleeves 18f, 18r may be bonded to the frame or clamped thereto. The sealing elements 15 may be integrated with the mesh sleeves 18.

In operation, the fans 6 draw air into the ventilation module 4, pressurising the front region 4a of module and the space within the tubular sleeves 18 above the air supply opening 13 to a superambient pressure. Air within this space then passes out through the mesh sleeves into the interiors of the circuit modules 3, providing a cooling air flow over the electronic components. The fans 6 may generate a superambient pressure in the front region 4a and within the sleeves 18f that is from 0.001 to 0.005 bar above the surrounding atmosphere, i.e. above the pressure within the interior of the module 3. The area and permeability of the membrane from which sleeve 18f is formed is chosen for each module so that the overpressure within the sleeve provides an air flow rate through the sleeve adequate to cool the components in that module. The area and permeability of the membrane may be chosen to provide a volumetric flow of air of from 0.5 to 100 $m^3$/hour, preferably from 10 to 50 $m^3$/hour into the module.

The fans 6 provide substantially the same superatmospheric pressure within all of the sleeves 18f. If the sleeves 18f all have the same surface area and are all made from the same material, then equal amounts of air will be delivered to the interiors of the circuit modules 3. If the cooling requirements of one circuit module 3 exceed those of the others, then the cross-sectional are of the sleeve 18f of that circuit module may be enlarged to provide a greater surface area to the sleeve and therefore a greater mass flow of air into the module 3, or the sleeve may be made more permeable for example by using a larger mesh or a more open-celled foam.

The rear region 4b of the ventilation module 4 is connected, via the aspiration opening 14, to the interiors of the sleeves 18r of the circuit modules 3, and thus the operation of the extractor fans 8 reduces the pressure within the sleeves 18r to below ambient, drawing air into the sleeves 18r from the interiors of the circuit modules. The sleeves 18r may be made from a material which is more porous than that of the sleeves 18f, and thus presents less resistance to the flow of air therethrough.

Where extractor fans 8 are provided, the fans 8 may be arranged to reduce the pressure in the region 4b and within the sleeves 18r from 0.001 to 0.005 bar below the pressure within the circuit modules 3.

The area and permeability of the membranes of sleeves 18r may be adjusted for each module so that the pressure drop across the sleeve 18r is greater than or the same as that across the sleeve 18f of the module. This arrangement provides a slight pressurisation of to the module 3 above ambient so that any air leakage from module 3 is outward, preventing ingress of dust. Where mesh is used for sleeves 18f and 18r, the openings in the mesh may be from 0.05 to 1 mm$^2$ in area.

FIG. 6 illustrates in perspective view a circuit module 3 in which the sleeve 18f is generally rectangular in cross-section, and has a cross-sectional area substantially greater than that of the opening in the undersurface 17 of the module 3. Extending away from the sleeve 18f is a deflector plate 20, which deflects the flow of air issuing through the sleeve 18f towards a component requiring a particularly high flow of cooling air. It will be understood that the sleeve 18f may have any convenient cross-sectional shape, and the deflector plate 20 may be straight, curved or angular. A number of deflector plates 20 of plastics or metal sheet may be provided to collect the air flowing out of the sleeve 18f and direct it to components 5a requiring particularly high cooling flows.

In the embodiment shown in FIG. 6, the sleeve 18r is omitted, and the lower surface 17 of the module is simply formed with an opening which aligns with an opening in the upper surface of the next module below. Since the ingress of dust through the exhaust openings will be prevented by the nett outflow of air, the mesh sleeves 18f can be relied upon to effectively filter the incoming cooling air. Alternatively, air filters may be provided adjacent to the fans 6 in the ventilation module 4, to prevent the sleeves 18f from becoming clogged. The absence of sleeves 18r removes the need for extractor fans 8 in the ventilation module 4, since the resistance to flow of air out of the module 3 is decreased. Permeable sleeves 18r may be provided, however, to produce a slight resistance to exhaust air flow and thus produce a slight pressurisation of the interior of the module to counter inward air leakage.

The ventilation module 4 is shown in the foregoing embodiment positioned below the circuit modules 3. By providing additional air supply and aspiration openings in the undersurface of the ventilation module 4, the ventilation module 4 may be placed at any position within the vertical array of circuit modules. Removable blanking plates, of material similar to the material of the module casing 21 may be provided in the ventilation module 4 to cover any unused openings in the upper or lower surfaces of the ventilation module 4.

It is also possible, by placing the blanking plates 21 over the openings in the upper surface of the ventilation module 4, to mount the ventilation module 4 as the uppermost module with the circuit modules 3 mounted below. In such an arrangement, the openings in the lower surface of the lowermost circuit module may be provided with blanking plates to close them off.

The ventilation module may be provided with removable blanking plates 21 for all its air supply and exhaust openings 13 and 14, and such blanking plates as are unused may be stored internally within the regions 4a and 4b of the ventilation module, or externally by attaching them to the upper of lower faces of the module.

If a module 3 is to be removed from the assembly for maintenance, the continuity between the sleeves 18f and 18r of the remaining modules 3 may be provided for by inserting an impermeable tubular component to bridge the gap left by the absent module. Alternatively, a "dummy" module 3 having no electronics components and having impermeable tubular sleeves may be inserted in place of a removed module, to enable the remaining modules to continue in operation without overheating. FIG. 7 shows such a dummy module, which comprises a baseplate 30 and mounting rails 31 for mounting the baseplate 30 to a rack. The baseplate 30 has openings 32 and 33 aligned with the openings 13, 14 of the ventilation module 4 and with openings 16a, 16b of the module 3. Impermeable tubular sleeves 34 and 35 surround the openings 32 and 33 and extend above the baseplate 30 by the height of a module 3. Sealing elements 15 are provided at the tops of sleeves 34 and 35.

When a module 3 is removed from the supporting structure or rack for maintenance, the dummy module of FIG. 7 is inserted into the slot vacated by the removed module. The baseplate 30 of the dummy module engages the seals 15 of the module below, and the seals 15 of the dummy module engage the undersurface of the next module above, so that sleeves 34 and 35 replace the sleeves 18f and 18r, respectively, of the removed module and cooling air supply to all the remaining modules 3 is assured, and their operation may continue uninterrupted.

When the removed module 3 is repaired, then dummy module 7 is removed from the slot and the repaired module replaced.

What is claimed is:

1. A modular electronic circuit comprising:
   a number of circuit modules each having a housing containing circuit elements;
   a passageway extending through the housings of the modules and having a permeable wall portion through which air may pass to provide communication between the interior of the passageway and the interior of at least one module housing; and
   a ventilator operable to cause air to flow through said permeable wall portion.

2. The modular electronic circuit of claim 1 wherein the passageway is formed by a number of aligned tubular elements each positioned within a respective module housing.

3. The modular electronic circuit of claim 1, wherein the ventilator is housed in a ventilation module housing an air supply opening in communication with the passageway.

4. The modular electronic circuit of claim 1, wherein two parallel passageways extend through the module housings.

5. The modular electronic circuit of claim 4, wherein the ventilator is housed in a ventilation module having air supply openings in communication with the two parallel passageways.

* * * * *